(12) United States Patent
Matsuoka et al.

(10) Patent No.: US 8,334,204 B2
(45) Date of Patent: Dec. 18, 2012

(54) SEMICONDUCTOR DEVICE AND MANUFACTURING METHOD THEREFOR

(75) Inventors: Takaaki Matsuoka, Minato-ku (JP); Shinji Ide, Hillsboro, OR (US); Yoshiyuki Kikuchi, Hillsboro, OR (US)

(73) Assignee: Tokyo Electron Limited, Tokyo (JP)

( * ) Notice: Subject to any disclaimer, the term of this patent is extended or adjusted under 35 U.S.C. 154(b) by 566 days.

(21) Appl. No.: 12/220,555

(22) Filed: Jul. 24, 2008

(65) Prior Publication Data

US 2010/0022048 A1 Jan. 28, 2010

(51) Int. Cl.
*H01L 21/4763* (2006.01)

(52) U.S. Cl. ........ 438/637; 438/643; 438/672; 438/687; 257/E21.577

(58) Field of Classification Search .................. 438/637, 438/643, 687
See application file for complete search history.

(56) References Cited

U.S. PATENT DOCUMENTS

| 6,756,293 B2 * | 6/2004 | Li et al. .......................... 438/595 |
| 2006/0113674 A1 * | 6/2006 | Toyoda et al. ................. 257/762 |
| 2007/0173071 A1 * | 7/2007 | Afzali-Ardakani et al. .. 438/781 |

FOREIGN PATENT DOCUMENTS

| JP | 11-233630 A | 8/1999 |
| JP | 2003-142579 | 5/2003 |
| JP | 2003-347299 | 12/2003 |
| JP | 2006-165597 | 6/2006 |
| JP | 2006-294679 | 10/2006 |
| KR | 10-0746543 | 4/2001 |
| KR | 10-2002-0025806 | 4/2002 |
| KR | 10-2004-0084737 | 10/2004 |
| KR | 2007-21323 | 2/2007 |
| KR | 2007-26128 | 3/2007 |
| WO | 2007-020684 A1 | 2/2007 |

OTHER PUBLICATIONS

Contents of KR Office Action in KR Patent Application No. 2008229935, dispatched date Feb. 9, 2011, issued by Patent Examiner in KIPO.

"Contents of the Notice for a submission of opinion" in KR Patent Application No. 10-2009-0055994, dispatched date Nov. 17, 2011, issued by Patent Examiner in KIPO.

Contents of KR Office Action in KR Patent Application No. 2008229935, dispatched date Aug. 11, 2011, issued by Patent Examiner in KIPO.

* cited by examiner

*Primary Examiner* — Alexander Ghyka
(74) *Attorney, Agent, or Firm* — Pearne & Gordon LLP

(57) ABSTRACT

The present invention relates to a manufacturing method for a semiconductor device, the method includes a process for forming an interlayer film on a substrate, a process for forming an opening in the interlayer, a process for forming a conductive layer which fills the opening, and a process for forming a cap film on the surface of the conductive layer. In the process for forming the cap film, a reduction process for the surface of the conductive layer and the forming of the film are performed simultaneously.

11 Claims, 4 Drawing Sheets

US 8,334,204 B2

SEMICONDUCTOR DEVICE AND MANUFACTURING METHOD THEREFOR

TECHNICAL FIELD

The present invention relates to a semiconductor device and a manufacturing method therefor, and specially relates to a semiconductor device having a wiring mainly containing copper and a manufacturing method therefor.

BACKGROUND OF THE INVENTION

In recent years, with the speed-up and high integration of semiconductor integrated circuit, miniaturization of elements, such as transistors, has progressed. Corresponding to this miniaturization, miniaturization of wiring has been attempted to improve a wiring delay.

For this reason, the wiring using a copper (Cu), which has a lower resistance and high EM (Electro-migration) resistance property, has been actively developed instead of the aluminum alloy conventionally used in the wiring material of LSIs (Large Scale Integration).

However, in the wiring mainly containing the copper, a cap film is formed on the wiring in order to suppress the copper from diffusing into an insulator formed over the wiring. Meanwhile, an oxide may be formed on the surface of the wiring before forming the cap film, because the copper has a property that is easy to be oxidized. This may contribute to the reduction in the adhesiveness between the wiring and the cap film. Thus, methods for forming the cap film, which has favorable adhesiveness, onto the wiring have been developed. Following are the examples of conventional techniques to achieve objectives described above.

Unexamined Japanese Patent Application Publication No. 2003-347299 discloses a technique for forming a cap film on a wiring by a process for accumulating an insulator on the wiring by a chemical vapor deposition method using a organosilane gas as a film forming gas after forming the wiring mainly containing a copper, applying an ammonia plasma process, and apply a solution heat treatment of a first atom to the surface of the wiring in order to suppress or prevent the copper infusion.

Unexamined Japanese Patent Application Publication No. 2006-165597 discloses a technique for forming an insulator for wiring capping without oxidizing a conductive barrier film of a wiring mainly consisting of copper. Specifically, when performing a reducing plasma process to a buried second layer wiring L2, the power applied to a first electrode retaining a wafer is reduced to a lower value compare to a second electrode facing to the wafer, or down to zero. In this way, the exposed surface of the conductive barrier film 17a of the buried second layer wiring L2 is azotized, thus the disclosed technique is capable of suppressing or preventing the exposed section of the conductive barrier film 17a from being oxidized.

Unexamined Japanese Patent Application Publication No. 2006-294679 discloses a manufacturing method of a semiconductor device, and the method includes the steps of forming an insulator having a relative permittivity of not more than 3 onto a substrate, forming a wiring consisting of Cu in the insulator, supplying a reducing gas on the surface of the wiring, and forming a barrier film on the wiring after supplying the reducing gas. That is, it is characterized by forming the barrier film without supplying a plasma to the surface of the wiring prior to forming the barrier film.

Unexamined Japanese Patent Application Publication No. 2003-142579 discloses a technique of preventing a conductive barrier film 17a of a buried second layer wiring L2 from oxidizing in a semiconductor device having the buried wiring structure comprising copper when forming an insulator 15b for wiring capping, for example, by SiON film formed by a plasma CVD method using a mixed gas of trimethoxysilane gas and nitric oxide gas. Specifically, a third insulator (insulator 15b) is accumulated on a second insulator by a chemical vapor deposition method using a gas containing oxygen after accumulating the second insulator at least on the wiring to protect the first conductive film from oxidizing.

However, none of the conventional techniques described above do not realize the forming of cap film on the surface of the conductive layer by a simple process (treatment procedure) due to increase in the number of processes or substantive treatment procedures. For example, the Japanese Unexamined Patent Application Publication No. 2003-347299 requires a process of solution heat treatment of first atom after applying an ammonia plasma process, thus, increase in the number of process (treatment procedure) cannot be avoided. For this reason, the development of a technique capable of forming a cap film on a conductive layer surface using a simpler process (treatment procedure) has been desired.

SUMMARY OF THE INVENTION

A manufacturing method for a semiconductor device pertaining to the present invention, the method including the steps of forming an interlayer over a substrate, making an opening in the interlayer, creating a conductive layer in the opening, and forming a cap film on a surface of the conductive layer, wherein the step for forming the cap film includes a reduction treatment to the surface of the conductive layer and a film forming treatment, which are simultaneously performed.

According to the manufacturing method of the semiconductor device pertaining to the present invention, the forming treatment of the cap film and the reduction treatment to the surface of the conductive layer containing copper are simultaneously performed. For this reason, a favorable cap film can be formed on the conductive layer surface by one treatment. That is, because the removal of the oxide film from the conductive layer surface and the forming of the cap film are started concurrently, the forming of the cap film can be started without the surface of the conductive layer being re-oxidized. As a result, a cap film with a favorable adhesiveness can be formed on the conductive layer. Therefore, the metal atom consisting the conductive layer is suppressed from diffusing into the interlayer arranged on the conductive layer, and a semiconductor device with a high-reliability can be manufactured.

In the manufacturing method of the semiconductor device pertaining to the present invention, the conductive layer may include copper. In this embodiment, a low resistance wiring can be formed. Especially, the copper is a metal that is easily oxidized, however, by performing the reduction treatment and the film forming treatment simultaneously, a semiconductor device in which the diffusion of the copper atom into the interlayer is suppress, can be provided.

In the manufacturing method of the semiconductor device pertaining to the present invention, the plasma treatment may be performed to the substrate after generating plasma of at least either the source gas or the supply gas in the process for forming the cap film. According to the embodiment, the plasma treatment is performed to the substrate after generating plasma of gas for at least either the reduction treatment or the film forming treatment in the process of forming the cap film. For this reason, the damage to the members that are directly exposed to the plasma, such as a substrate, can be minimized compare to a case where applying a plasma treatment method by generating plasma under the presence of a substrate.

In the manufacturing method of the semiconductor device pertaining to the present invention, the step for forming the cap film may include changing a bias power applied to the substrate while forming the cap film.

In the manufacturing method of the semiconductor device pertaining to the present invention, the supply gas for forming the protection film may include an organic silicon compound containing not less than one hydrogen atom.

In the manufacturing method of the semiconductor device pertaining to the present invention, the supply gas for forming the protection film may include at least trimethylsilane.

In the manufacturing method of the semiconductor device pertaining to the present invention, the supply gas for forming the protection film may include a compound containing nitrogen.

In the manufacturing method of the semiconductor device pertaining to the present invention, it is preferable to form a barrier film on an inner surface of the opening after forming the opening and before forming the conductive layer In the manufacturing method of the semiconductor device pertaining to the present invention, the barrier film may include at least tantalum.

The manufacturing method of a semiconductor device pertaining to the present invention including the steps of forming an insulator over a substrate, making an opening in the insulator, creating a conductive layer in the opening, and forming a protection film at least on a surface of the conductive layer, wherein the step of forming protection film includes a reduction treatment to a surface of the conductive layer and a film formation treatment for the protection film, and supply gas for the protection film is used as a source gas for reduction species.

According to the manufacturing method of the semiconductor device pertaining to the present invention, the supply gas for forming the protection film may be used as a source gas for generating reduction species for the reduction treatment on the conductive layer surface. For this reason, a favorable protection film can be formed on the conductive layer surface by one treatment. Normally, the supply gas needs to be changed for removing an oxide film on the conductive layer surface and for forming the protection film. However, the present invention does not require changing the supply gas. As a result, the reduction on the conductive layer surface and the forming of the protection film can be realized by a simpler method.

In the manufacturing method of the semiconductor device pertaining to the present invention, the conductive layer may contain copper as a major proportion.

According to the embodiment, a low resistance wiring can be formed. Especially, the copper is a metal that is easily oxidized, however, by performing a reduction treatment and a film forming treatment simultaneously, a semiconductor device, in which the diffusion of the copper atom into the interlayer is suppressed, can be provided.

In the manufacturing method of the semiconductor device pertaining to the present invention, either the reduction treatment or the film formation treatment is performed to the substrate after generating plasma of the supply gas in the process of forming the protection film.

In the manufacturing method of the semiconductor device pertaining to the present invention, the supply gas for forming the protection film may include an organic silicon compound containing not less than one hydrogen atom.

According to the embodiment, the hydrogen atom in the organic silicon compound used as a supply gas is disassociated during the process of generating plasma. This disassociation component can function as the reduction species. For this reason, the reduction of the conductive layer surface and the forming of the cap film can be performed simultaneously by using this organic silicon compound. In addition, the organic silicon compound referred in the present invention may be an organic compound having a C—Si bond. Also, $C_xH_y$ gas (wherein x and y in the formula are natural number.) may be used in the forming of the cap film. When the $C_xH_y$ gas is used in the forming of the cap film, α-C film can be formed.

In the manufacturing method of the semiconductor pertaining to the present invention, the supply gas for forming the protection film may include at least trimethylsilane.

In the manufacturing method of the semiconductor device pertaining to the present invention, the supply gas for forming the protection film may include a compound containing nitrogen.

In the manufacturing method of the semiconductor device according to the present invention, a barrier film may be formed on an inner surface of the opening before forming the conductive layer.

In the manufacturing method of the semiconductor device according to the present invention, the barrier film may contain at least tantalum.

DETAILED DESCRIPTION OF INVENTION

An embodiment of the present invention will be hereinafter explained.
(Semiconductor Device)

Figure 1:
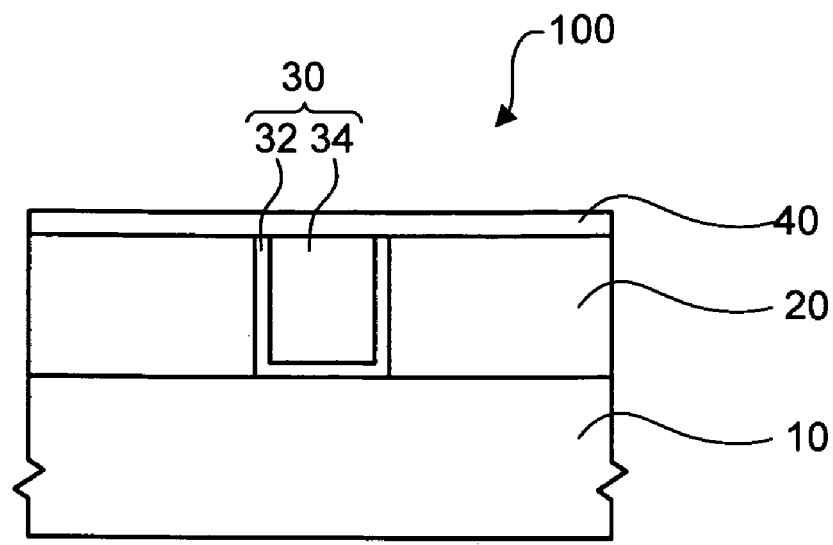
FIG. 1 is a cross-section diagram illustrating a semiconductor device manufactured by a manufacturing method related to an embodiment of the present invention.
Figure 2:
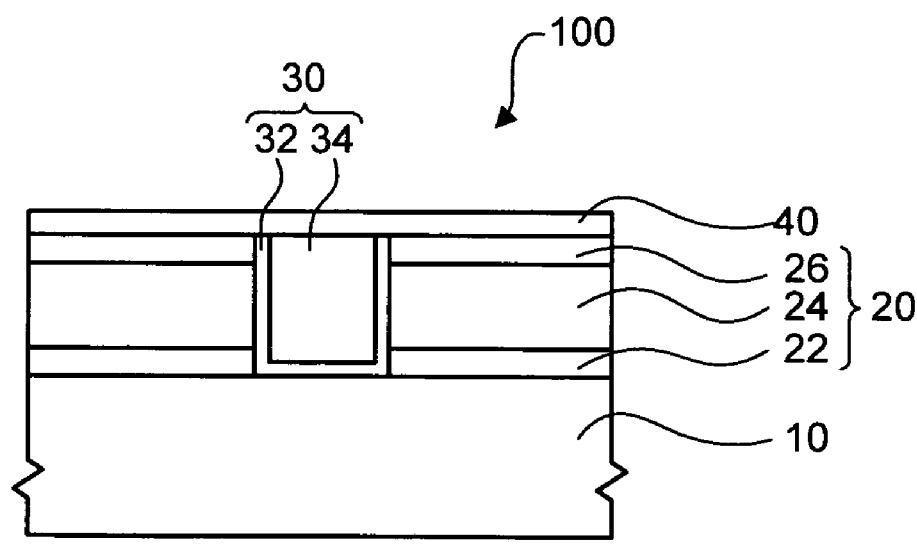
FIG. 2 is a cross-section diagram showing a process of a manufacturing method of a semiconductor device related to the embodiment.

A semiconductor device related to an embodiment of the present invention will be explained with reference to FIGS. 1 and 2. FIGS. 1 and 2 are cross-section diagrams illustrating a semiconductor device pertaining to the embodiment. As shown in FIGS. 1 and 2, a semiconductor device 100 pertaining to the embodiment includes a substrate 10, an interlayer 20, a conductive section 30 and a cap film 40. In addition, the structures of the interlayers 20 are different for the semiconductor device shown in FIG. 1, and the semiconductor device shown in FIG. 2. The same reference numbers are applied to the members common to both semiconductor devices and the detailed explanation is omitted.

The interlayer 20 is provided over the substrate 10. Although the FIG. 1 does not illustrate a detail, various semiconductor elements, another wiring, and another interlayer (not shown) may be formed between the substrate 10 and the interlayer 20. The interlayer 20 may be formed by using one type of insulating material as shown in FIG. 1, or plural types of insulating material may be used as shown in FIG. 2. The conductive section 30 is formed from a barrier metal 32 and a conductive layer 34 mainly containing copper. The cap film 40 covers at least the conductive layer 34, and it is provided on the conductive section 30 and the interlayer 20 in the embodiment. Incidentally, the conductive layer 34 may be either a contact plug or a via plug. A "contact plug" means a conductive layer that electrically connects a conductive region, such as a source, a drain or a gate, formed at a semiconductor substrate and a wiring layer formed over the semiconductor substrate. A "via plug" means a conductive layer that electrically connects wiring layers over a semiconductor substrate with each other. In addition, the cap film 40 may be indicated as a protection layer 40.

The substrate 10 is a semiconductor substrate, and a single crystal silicon substrate or a semiconductor substrate of various compounds may be used.

As the interlayer 20, there can be used an insulating material, such as silicon oxide ($SiO_2$), silicon nitride ($Si_xN_y$), silicon carbide (SiC) and silicon carbonitride (SiCN), SiON film, SiCO film, SiCHO film or α-C or α-C:Si film. The interlayer 20 may be formed from one type of insulating material as shown in FIG. 1, or a plurality of insulating material layers different from each other may be laminated as shown in FIG. 2.

As shown in FIG. 2, in a case when a plurality of insulating material layers different from each other is laminated, it is preferable for a portion of the plurality of insulating layers to be a film made of a low permittivity material. Among the low-permittivity materials, there are some materials that are low in strength, which makes them difficult to be use by themselves. However, by adopting the low-permittivity layer as a portion of the interlayer, it contributes to the improvement of the wiring delay. The interlayer 20 in a laminate structure will be hereinafter explained with reference to FIG. 2.

As shown in FIG. 2, the interlayer 20 is configured by laminating a first insulator 22, a low-permittivity film 24, and a second insulator 26 in series. As the first insulator 22 and the second insulator 26, silicon oxide (SiO2), silicon nitride ($Si_xN_y$), silicon carbide (SiC) and silicon carbonitride (SiCN), SiON film, SiCO film, SiCHO film or α-C or α-C:Si film may be used. The first insulator 22 and the second insulator 26 may be the same material or materials that are different from each other. The second insulator 26 acts as a hard mask of the low-permittivity film 24 at a patterning when forming an opening 31.

A carbon-containing silicon oxide film, a porous oxide silicon film, a film containing carbon, oxygen and hydrogen (SiCOH film), a fluorine added carbon film (hereinafter referred as "fluorocarbon film") that is a compound of carbon (C) and fluorine (F) may be considered as the low-permittivity film 24. Especially, a fluorocarbon film that is low in relative permittivity is preferred. At this time, the fluorocarbon film is generally a CF series material that is indicated by ($—C_xF_y—$) n (wherein x, y and n in the formula are natural number.).

The conductive section 30 passes through the interlayer 20. And, it functions to connect a lower layer wiring (not shown) and an upper layer wiring (not shown). Concretely, the conductive section 30 is configured by the opening 31, which passes through the interlayer 20, a barrier film 32, which covers the inner surface of the opening 31 and a conductive layer 34, which fills the opening 31. Incidentally, the opening 31 may be either a contact hole, or a via hole or a through hole. A "contact hole" means an opening to be filled with a conductive layer that electrically connects a conductive region, such as a source, a drain or a gate, formed at a semiconductor substrate and a wiring layer formed over the semiconductor substrate. A "via hole" or a "through hole" means an opening to be filled with a conductive layer that electrically connects wiring layers over a semiconductor substrate with each other.

The barrier film 32 functions to increase the adhesiveness of the metal material structuring the conductive layer 34 and the interlayer 20, and to suppress the metal material from diffusing into the interlayer 20. As the barrier film 32, a high-melting point metal or a high-melting point metal compound may be used. Specifically, Ta TaN, $T_i$, $T_iN$ may be considered. The film thickness of the barrier film is preferably less than 10 nm.

It is preferable to form the conductive layer 34 with a conductive material mainly containing copper. This realizes the low resistance wiring.

The cap film 40 is formed at least on the conductive layer 34. The cap film 40 is a layer for suppressing the diffusion of the conductive material to an interlayer formed over the conductive section 30 (not shown), and diffusion of the main component forming the contact. Specifically, the film thickness of the cap film 40 is preferable from 10 to 30 nm. Also, the film thickness of the cap film 40 is preferable less than 10 nm. As the cap film 40, SiCN film, SiC film, and α-C film or α-C:Si may be used. In addition, the cap film 40 of the embodiment may also be referred to as a protective film 40.

(Manufacturing Method of the Semiconductor Device)

Next, a manufacturing method of the semiconductor device pertaining to the present invention will be explained. The manufacturing method of the semiconductor device of the present invention includes a process for forming an interlayer on a substrate, a process for forming an opening on the interlayer, a process for forming a conductive layer, which fills the opening, and a process for forming a cap film on the surface of the conductive layer. In the process of forming the cap film, reduction of the surface of the conductive layer and the forming of the cap film are performed simultaneously. Further, the manufacturing method of the semiconductor device pertaining to the present invention is characterized that the film forming gas and the reduction gas that generates (supplies) the reduction species for reducing the surface of the conductive layer in the process for forming the cap film are identical.

An embodiment of the manufacturing method of the semiconductor device pertaining to the present invention will be hereinafter explained with reference to FIGS. 3 to 6. FIGS. 3 to 6 are cross-section diagrams illustrating a process of a manufacturing method of a semiconductor device related to the embodiment. In addition, explained hereinafter is the manufacturing method of the semiconductor device, which is shown in FIG. 2, where a fluorocarbon film is adopted to the low-permittivity film 24. Needless to say, the scope of the present invention is not limited to the structure of such an interlayer.

Figure 3:
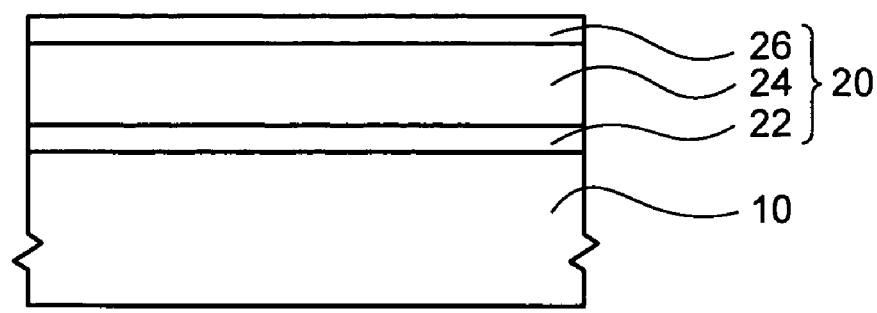
FIG. 3 is a cross-section diagram showing a process of a manufacturing method of a semiconductor device related to the embodiment.

First, the interlayer 20 is formed on the substrate 10 as shown in FIG. 3. Specifically, a first insulator 22 is formed. The insulating material that can be used as the first insulator 22 is as what is noted above and it is preferably SiCN. As a forming method, for example, a CVD method can be adopted.

In a case when SiCN is formed as the first insulator 22, methane and silane, monomethyl silane (1MS), dimethylsilane (2MS), trimethyl silane (3MS), tetramethyl silane (4MS) and silazane may be considered as a film forming gas. The gas may be used by mixing them. Further, in addition to the gasses above, the deposition may be performed by adding nitrogen ($N_2$) and ammonia ($NH_3$). These gasses to be added are hereinafter referred as an additive gas.

Next, the fluorocarbon film 24 is formed on the first insulator 22. The forming method of the fluorocarbon film 24 is, for example, the CVD method. In a case when forming by the CVD method, $C_2F_4$, $C_2F_6$, $C_3F_8$, $C_4F_8$ and $C_6F_6$ may be considered as a material gas (film forming gas). At this time, as a CVD device, a parallel plate CVD device or a CVD device employing a microwave plasma using RLSA (Radial Line Slot Antenna) may be used. Further, the film thickness of the fluorocarbon film 20 is preferably around 100 nm.

Next, the second insulator 26 is formed on the fluorocarbon film 24. The second insulator 26 may be formed similar to the first insulator 22. This second insulator 26 functions as a hard mask in forming an opening described later, or a etching mask or CMP stopper in forming the conductive section 30.

Figure 4:
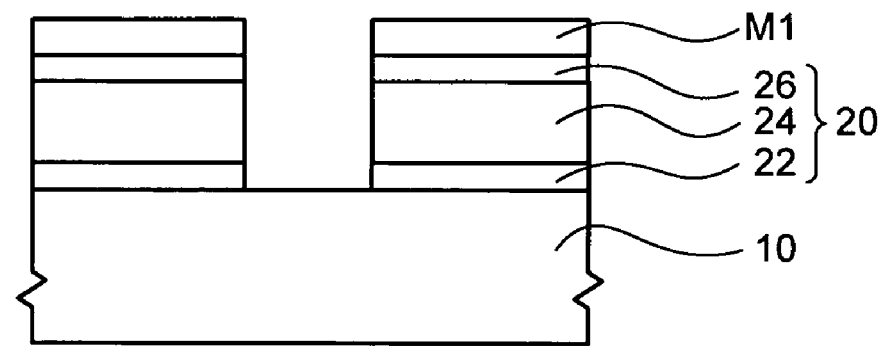
FIG. 4 is a cross-section diagram showing a process of a manufacturing method of a semiconductor device related to the embodiment.

Next, the opening 31 of the interlayer 20 is formed as shown in FIG. 4. In this process, specifically, a mask M1 having an opening in a predetermined area on the interlayer 20 is formed. As the mask M1, for example, a resist may be used. Next, the opening 31 may be formed by etching the interlayer 20 using the mask M1 as a mask. The etching of the interlayer 20 may be performed by, for example, a wet etching method or dry etching method.

Figure 5:
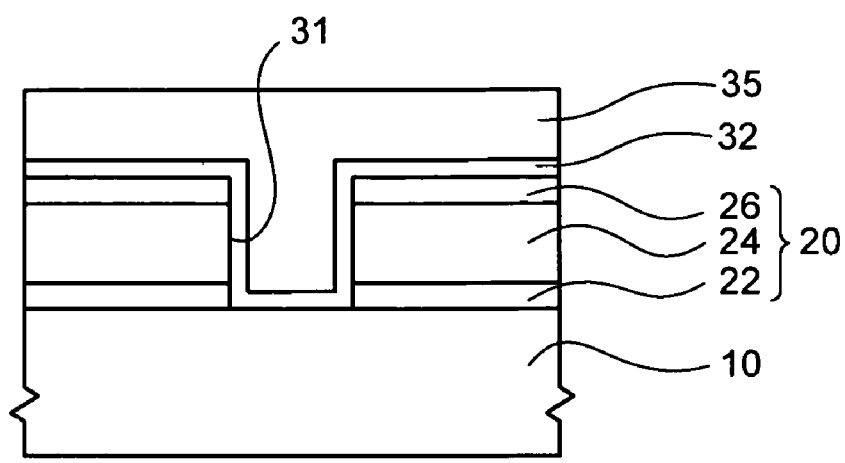
FIG. 5 is a cross-section diagram showing a process of a manufacturing method of a semiconductor device related to the embodiment.

Next, the conducting section 30 is formed on the opening 31. When forming the conductive section 30, first, the barrier film 32 is formed at least on the inner surface of the opening 31 as shown in FIG. 5. The barrier film 32 may be formed by, for example, a sputtering method. Next, the conductive material layer 35, which becomes the conductive layer 34, is formed so as to cover inside the opening 31 and over the interlayer 20. The conductive material layer 35 is preferably mainly configured by copper. The sputtering method or a plating method may be used to form the conductive material layer 35.

Figure 6:
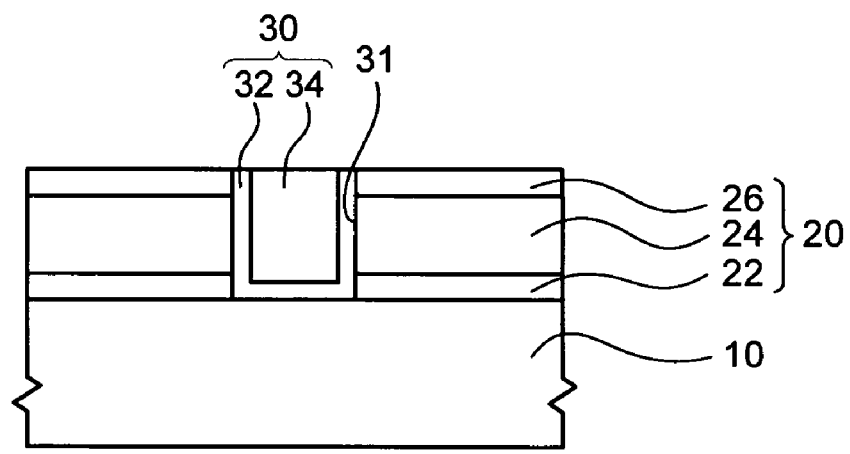
FIG. 6 is a cross-section diagram showing a process of a manufacturing method of a semiconductor device related to the embodiment.

Next, a portion of the conductive material layer 35 and the barrier film 34 is removed until the upper surface of the interlayer 20 is exposed thereafter as shown in FIG. 6. The removal of the conductive material layer 35 and the barrier film 32 may be performed by a CMP (Chemical Mechanical Polishing) method. In this way, the conductive section 30 can be formed inside of the opening 31.

Next, the cap film 40 is formed at least on the conductive section 30 as referenced in FIG. 1 or 2. As for the cap film 40, for example, SiCN film SiC film or α-C film or α-C:Si may be formed. This cap film 40 serves to prevent the conductive material configuring the conductive section 30 from diffusing to an interlayer (not shown) formed over the conducive section 30. A method for forming the cap film 40 will be hereinafter explained in detail.

In the manufacturing method of the semiconductor device related to the embodiment, the reduction process of the exposed surface of the conductive section 30 and the forming of the cap film 40 are performed simultaneously in the forming process of the cap film 40. Further, in the manufacturing method of the semiconductor device related to the embodiment, the reduction process of the exposed surface of the conductive section 30 is performed under the condition (in an atmosphere) that an atmosphere for forming the cap film 40 is maintained.

Forming of the cap film 40 may be performed by the plasma CVD method. Meanwhile, the reduction process is performed by exposing the substrate in an atmosphere containing reduced species in a plasma state. That is, in the manufacturing method of the semiconductor device pertaining to the embodiment, performing the reduction process and the forming of the cap film 40 simultaneously can also mean that the film forming gas and the reduction gas are supplied simultaneously in a plasma processing chamber.

At this time, the plasma processing chamber means an environment that is capable of exposing the substrate in an atmosphere of plasmanized film forming gas, or reduction species supply gas. For example, in a case of the plasma CVD device, a film forming chamber is equivalent to the plasma processing chamber. As the method for plasmanizing the film forming gas or the reduction species supply gas, the parallel plate plasma generation device or the microwave plasma generation device using RLSA (Radial Line Slot Antenna) may be used.

Further, in the semiconductor device pertaining to the embodiment, when exposing the substrate 10 in the plasma atmosphere of the film forming gas and the reduction species supply gas, it is preferable to generate the plasma of supply gas and film forming gas in advance and then contact the substrate 10. In this way, the damage to the substrate 10 can be reduced.

Thus, it is preferable to use a microwave plasma source using RLSA (Radial Line Slot Antenna) as the method for generating the plasma in advance. According to this, a high-density and low electron temperature plasma can be generated. By using this RLSA plasma, the generation of the reduction species can be performed more securely.

As the reduction species supply gas and the film forming gas, an organic silicon compound containing one or more hydrogen atoms (hereinafter may be referred as a "specific organic silicon compound") may be used. As such organic silicon compound, monomethyl silane (1MS), dimethyl silane (2MS), trimethyl silane (3MS) and tetramethyl silane (4MS) may be used. Also, as the reduction species supply gas and the film forming gas, a hydrocarbon containing one or more hydrogen atoms may be used. As such hydrocarbon, $CH_4$, $C_2H_2$, $C_5H_{10}$, $C_5H_8$ and $C_4H_6$ may be used. Further, as the film forming gas, an additive gas other than the organic silicon compound and the hydrocarbon may be used as needed. As the additive gas, $NH_3$, $N_2$, and Ar may be exemplified. And, the substrate is exposed in the plasma atmosphere of the reduction species supply gas and the film forming gas.

In the manufacturing method of the semiconductor device related to the embodiment, the film forming gas for the cap film 40 may be used as the reduction species supply gas. As such a film forming gas, the specific organic silicon compound may be considered. The specific organic silicon compound contains one or more hydrogen atoms in the compound. The hydrogen atom disassociates by plasmanizing this, thereby this hydrogen atom performs the reduction process of the surface of the conductive section 30. In this way, according to the manufacturing method of the semiconductor device pertaining to the embodiment, there is no need for switching the reduction gas and the film forming gas. Thus, the cap film 40 is formed on the conductive section 30 in a simple process.

The temperatures for the reduction process and the film forming process are preferably 200~400° C. The pressure in the processing chamber is preferably 50 mTorr~500 mTorr and the flow rate of trimetyl silane, the organic silicon compound, is preferably 20-500 sccm.

A bias power may be applied to the substrate 10 at the process of forming the cap film 40. Further, the bias power may be applied continuously or intermittently during the forming of cap film 40, or the bias power may be started or stopped during the process. The bias power applied to the substrate is preferably 10~120W.

In a case when the additive gas other than the organic silicon compound is used as a film forming gas, the timing for supplying the gas may be at the same time the organic silicon compound is supplied However, the supply of the gas into the process atmosphere is preferably delayed from the supplying the organic silicon compound. Specifically, it is preferable to supply the film forming gas other than the organic silicon compound by the time the reduction of the surface of the conductive section 30 is completed. That is, after the surface of the conductive section 30 is completely covered by the film. At this time, it is preferable to supply the film forming gas other than the organic silicon compound into the process atmosphere after plasmanizing the gas.

Further, in a case when the additive gas is used as a film forming gas and the bias power is applied to the substrate 10, it is preferable to start supplying the additive gas after the surface of the conductive section 30 is completely covered by the film, to apply the bias power when the forming process of the cap film 40 begins, and to stop applying the bias power when the additive gas is started to be supplied. In this embodiment, there is an advantage of enhancing the hermetic performance more than without supplying bias power.

According to the manufacturing method of the semiconductor device of the embodiment, the forming of the cap film 40 and the reduction process of the surface of the conductive layer 34 are performed simultaneously in the forming process of the cap film 40. For this reason, a favorable cap film 40 can be formed on the surface of the conductive layer 34 (conductive section 30) by one process. That is, because the forming of the cap film is started concurrently with the removal of the oxide film on the surface of the conductive layer 34, the forming of the cap film 40 can be started without the surface of the conductive layer 34 being re-oxidized. As a result, the cap film 40 with a favorable adhesiveness can be formed on the conductive layer 34. Thereby, the metal atom consisting the conductive layer 34 is suppressed from diffusing into the interlayer arranged on the conductive layer 34, thus the semiconductor device with a high reliability can be formed.

Figure 7:
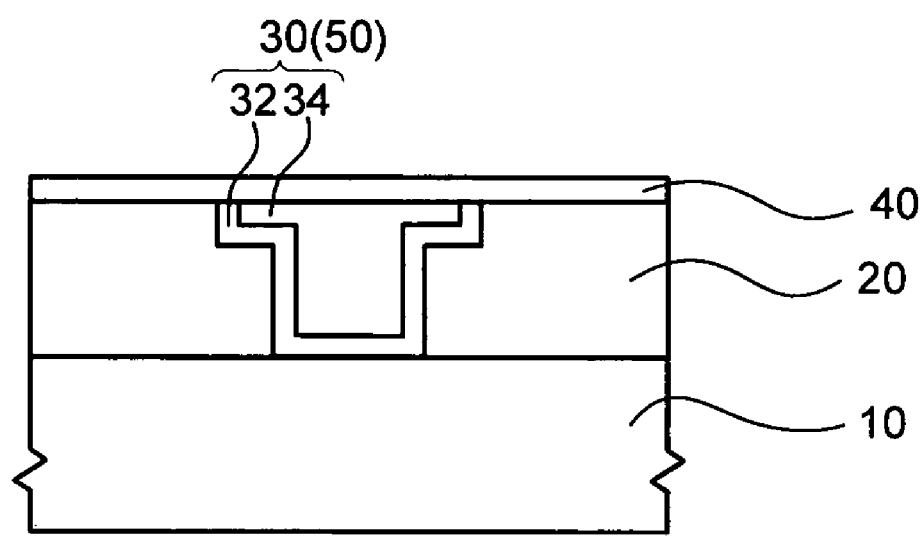
FIG. 7 is a cross-section diagram showing a process of a manufacturing method of a semiconductor device related to the embodiment.

Further, the embodiment described above discloses the method for forming the conductive section 30 by the single damascene method, but the embodiment of the present invention is not limited to this. For example, the dual damascene method may be used. In such a case, as shown in FIG. 7, the conductive section 30 and the wire 50 are formed as a unit in the interlayer 20, and the cap film 40 is formed thereon.

What is claimed is:

1. A manufacturing method for a semiconductor device, comprising the steps of:

forming an interlayer over a substrate;
making an opening in the interlayer;
forming a conductive material layer in the opening and on the interlayer;
removing a portion of the conductive material layer by a chemical mechanical polishing method until an upper surface of the interlayer is exposed; and
forming a cap film on a surface of the conductive layer after the portion of the conductive material layer is removed;
wherein the step of forming the cap film includes a reduction treatment to the surface of the conductive layer and a film forming treatment, which are simultaneously performed, and no additional reduction treatment step is performed to the surface of the conductive layer before the cap film is formed;
wherein the interlayer includes a first insulating film, a low-permittivity film and a second insulating film, the low-permittivity film comprising a fluorocarbon film or a porous oxide silicon film, the second insulating film comprising a silicon carbonitride.

2. The manufacturing method of claim 1, wherein the conductive layer contains copper.

3. The manufacturing method of claim 2, wherein a plasma treatment is applied to the substrate in the step of forming the cap film after creating at least one of plasma gas for the reduction treatment or gas for the film forming treatment.

4. The manufacturing method of claim 3, wherein the step of forming the cap film includes changing a bias power applied to the substrate while forming the cap film.

5. The manufacturing method of claim 4, wherein the cap film is formed by using an organic silicon compound containing not less than one hydrogen atom as a supply gas for forming a film.

6. The manufacturing method of claim 5, wherein the supply gas for forming a film includes at least trimethylsilane.

7. The manufacturing method of claim 6, wherein the supply gas for forming the film includes a compound containing nitrogen.

8. The manufacturing method of claim 7, further comprising: forming a barrier film on an inner surface of the opening before forming the conductive layer.

9. The manufacturing method of claim 8, wherein the barrier film contains at least Ta.

10. The manufacturing method of claim 1, wherein the cap film comprises any one of SiCN, SiC, $\alpha$-C and $\alpha$-C:Si.

11. The manufacturing method of claim 1, wherein the step of forming the conductive layer comprises:

forming a conductive material layer in the opening and on the interlayer; and
removing a portion of the conductive material layer by a Chemical Mechanical Polishing method until an upper surface of the interlayer is exposed.

* * * * *